US008278730B2

(12) United States Patent  (10) Patent No.: US 8,278,730 B2
Wahl et al.  (45) Date of Patent: Oct. 2, 2012

(54) HIGH VOLTAGE RESISTANCE COUPLING STRUCTURE

(75) Inventors: Uwe Wahl, Munich (DE); Markus Hammer, Pielenhofen (DE); Jens-Peer Stengl, Grafrath (DE)

(73) Assignee: Infineon Technologies Austria AG, Villach (AT)

( * ) Notice: Subject to any disclaimer, the term of this patent is extended or adjusted under 35 U.S.C. 154(b) by 405 days.

(21) Appl. No.: 12/607,230

(22) Filed: Oct. 28, 2009

(65) Prior Publication Data

US 2011/0095392 A1  Apr. 28, 2011

(51) Int. Cl.
*H01L 21/70* (2006.01)
(52) U.S. Cl. ........................................ 257/506; 257/510
(58) Field of Classification Search .................. 257/506, 257/510, 522
See application file for complete search history.

(56) References Cited

U.S. PATENT DOCUMENTS

2011/0095392 A1*  4/2011  Wahl et al. .................... 257/503
* cited by examiner

*Primary Examiner* — Mark Prenty
(74) *Attorney, Agent, or Firm* — Eschweiler & Associates, LLC

(57) ABSTRACT

The disclosed invention provides a structure and method for providing a high lateral voltage resistance between the electrical networks, sharing a lateral plane, of conductive elements (e.g., having different high voltage potentials) comprising a coupler. In one embodiment, an integrated coupler providing a high lateral voltage resistance comprises a primary conductive element and a secondary conductive element. An isolating material is laterally configured between the electrical network of the primary conductive element and an electrical network of the secondary conductive element. The isolating material may comprise a low-k dielectric layer and prevents any lateral barrier layers (e.g., etch stop layers, diffusion barrier layers, etc.) from extending between the first conductive element and the electrical network of the second conductive element. The structure therefore provides a galvanically isolated integrated coupler which avoids electrical shorting between circuits (e.g., at barrier layers) resulting in an improved high voltage resistance.

8 Claims, 11 Drawing Sheets

US 8,278,730 B2

HIGH VOLTAGE RESISTANCE COUPLING STRUCTURE

FIELD OF INVENTION

The present invention relates generally to integrated circuit isolation and in particular to a method and apparatus by which continuous barrier layers, located between conductive structures in an integrated chip, can be avoided.

BACKGROUND OF THE INVENTION

In many modern day circuit configurations, there is a need for electrical or galvanic isolation between different sections of the circuit. Galvanic isolation is often used where a potential voltage difference exists between circuits having different ground domains. If the circuits are not isolated, unwanted current can flow in the circuits (e.g., a ground loop current) leading to noise, signal degradation, circuit damage, or even electrical shock.

However, often the two or more electrically isolated circuits need to communicate for proper operation of a system. Couplers may be used to facilitate such communication. Couplers allow signals (e.g., information, energy) to be transferred between such electrically isolated circuits without terminating the electrical isolation. Energy transfer between circuits can be enabled using capacitive, optical, acoustic, magnetic, or mechanical means, for example. In the case of a magnetic coupler, a coil may be used to convert an electrical signal from one circuit to a magnetic field, which is transmitted through a dielectric medium providing galvanic isolation, to another electrically isolated circuit, where the magnetic field is converted back to an electrical signal.

DETAILED DESCRIPTION OF THE INVENTION

Figure 1A:
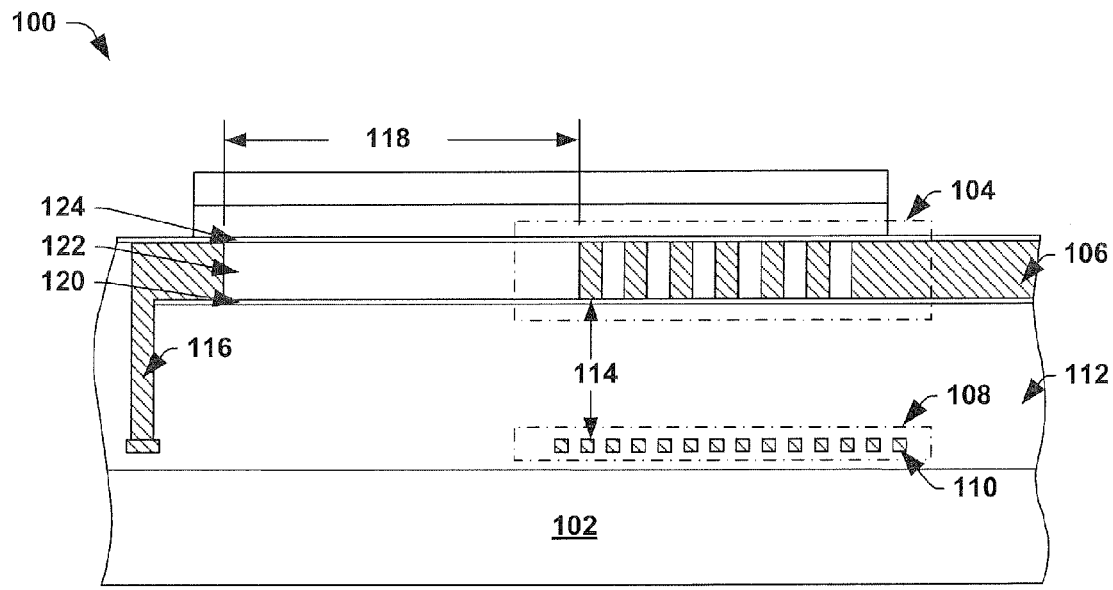
FIG. 1A illustrates a cross sectional view of an integrated chip comprising a magnetic coupler configured between two isolated circuits.

The present invention will now be described with reference to the attached drawing figures, wherein like reference numerals are used to refer to like elements throughout, and wherein the illustrated structures and devices are not necessarily drawn to scale.

Electrically isolated circuits have come to be widely used in modern day integrated chips. Often circuits comprised within a common integrated chip need to be electrically isolated to avoid harmful results such as ground loops, noise, temperature variations, etc. As circuits increase in speed and density, couplers are being developed to use a relatively small area while providing fast and accurate data transfer rates between isolated circuits. Magnetic couplers, configured to transfer signals between isolated circuits using a magnetic field, have been shown to be particularly useful in offering these qualities.

Magnetic couplers comprise one or more conductive elements (e.g., coils) configured to produce a magnetic field which is detected by one or more electrically isolated conductive elements (e.g., coils). To provide high performance magnetic couplers that occupy a small chip area, metal interconnect wires of an integrated chip may be used to form the conductive coupling elements (e.g., magnetic coupler coils). Using metal interconnect wires allows for the formation of coupling elements with a small manufacturing tolerance, thereby permitting coupler elements to be manufactured with only a small space between them.

Figure 1B:
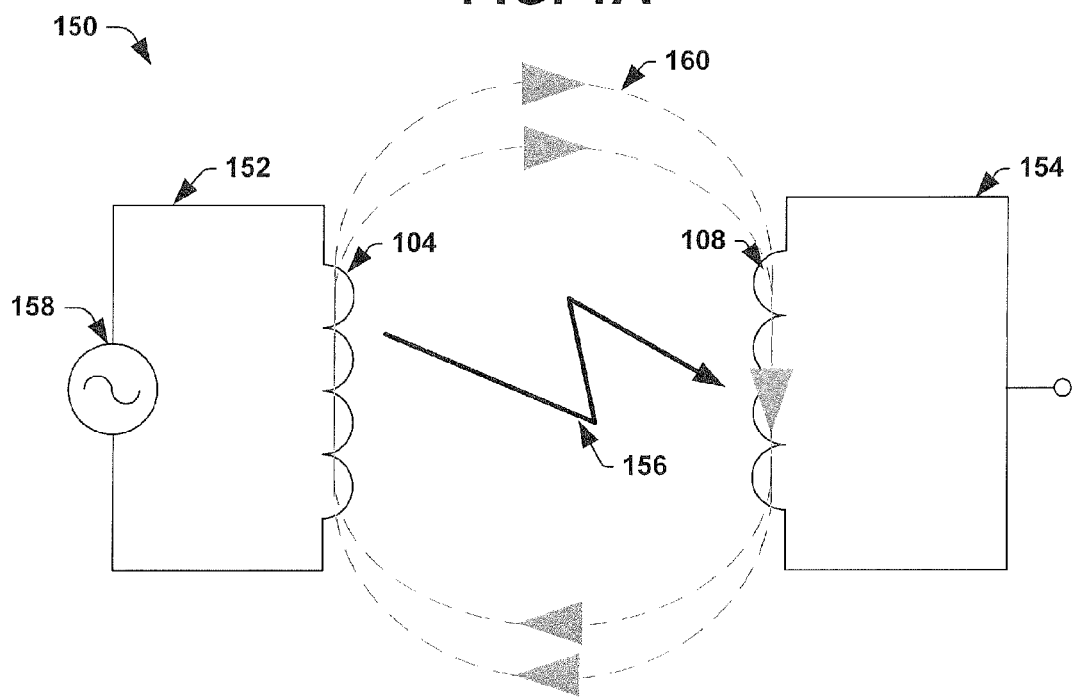
FIG. 1B illustrates a schematic diagram of the magnetic coupler configured between two isolated circuits as provided in FIG. 1A.

However, as illustrated in FIG. 1A, other structural considerations can still prevent proper operation of these closely spaced couplers. FIG. 1A illustrates an exemplary integrated magnetic coupler 100 formed on a semiconductor substrate 102. FIG. 1B illustrates a corresponding schematic diagram of integrated magnetic coupler 100. The magnetic coupler 100 is configured to have a primary coil 104 comprising a second metal interconnect level 106 (second metal level) and a secondary coil 108 comprising a first metal interconnect level 110 (first metal level). The primary coil 104 and the secondary coil 108 are separated in a vertical direction by an interlevel dielectric layer 112 having a low dielectric constant. As shown in FIG. 1A, the primary and secondary coils are separated by a vertical distance of 114.

One or more contacts 116 are configured to connect the secondary coil, comprising first metal level 110, to an upper metal level (e.g., second metal level 106). The contacts 116 therefore provide for an electric voltage potential, shared between the secondary coil 108 and a second metal level 106, laterally displaced from the primary coil 104. In particular, the electrical network of the primary coil (i.e., having a first voltage potential) and the electrical network of the secondary coil (i.e., having a second voltage potential) being separated by a lateral distance of 118 (i.e., sharing a lateral plane).

As further illustrated in FIG. 1A, a first etch stop layer 120, configured to prevent subsequent overetching of the second metal level 106, is located between the first dielectric layer 112 and the second metal level 106. The first etch stop layer 120 extends along the bottom of the second metal level 106. A second dielectric layer 122 may be configured above the first etch stop layer 120 to comprise the second metal level 106. Additionally, a second etch stop layer or diffusion barrier layer 124 may be configured above the second dielectric layer 122. Therefore, the first etch stop layer 120, the second dielectric layer 122, and the second etch stop layer 124 cumulatively comprise a plurality of vertically stacked and laterally displaced layers separating the electrical networks (i.e., and voltage potentials) of the primary and the secondary coils.

The inventors have appreciated that in high voltage technologies, the plurality of vertically stacked layers (e.g., 120, 122, and 124), also known as barrier layers, are easy to ionize since they show charges due to defective atomic bonds. The barrier layers are therefore often susceptible to electrical breakthrough (e.g., streaming, treeing) when exposed to a large voltage potential difference. Accordingly, when continuous barrier layers are configured to extend between conductive elements (e.g., a primary and a secondary coil of a coupler), having a large difference in voltage potential, electrical shorting due to electrical breakdown at the barrier layers can occur.

FIG. 1B illustrates a schematic diagram 150 illustrating a first electrical network 152 comprising a primary coil 104 (e.g., corresponding to element 104 in FIG. 1A) and secondary electrical network 154 comprising a secondary coil 108 (e.g., corresponding to element 108 in FIG. 1A). Cumulatively, the primary coil 104 and the secondary coil 108 comprise a magnetic coupler (e.g., as shown in FIG. 1A). The first electrical network 152 further comprises a current source 158, which is coupled to the primary coil 104 and which is configured to provide a current which flows through the primary coil 104 to produce a magnetic field 160 The magnetic field 160 produced by the primary coil is proportional to an input current supplied to the first conductive coil by the current source 158. Typically, the magnetic field 160 transverses the electrically insulating material (configured between the primary and secondary coils), and passes through the secondary coil 108. As the magnetic field 160 passes through the secondary coil 108, it induces a current that flows though the second electrical network 154. Therefore, the magnetic coupler provides for the transfer of signals between electrically isolated circuits using a magnetic field. However, in high voltage technologies electrical shorting 156 between the electrical networks of primary coil 104 and the secondary coil 108 due to electrical breakdown at the barrier layers can occur. In response to this electrical shorting, the inventors of the present invention have discovered a need for an improved structure and method of providing a high lateral voltage resistance between conductive elements of a coupler in an integrated chip.

In appreciation of the cause of the electrical shorting between coplanar conductive elements, the inventors of the present invention disclose a method and structure for providing an isolating material (i.e., a dielectric electrically insulating material), configured to have a high lateral voltage resistance, between the conductive elements having a large difference in voltage potentials. In general, the method and structure disclosed herein provide for a homogeneous electrically isolating material (e.g., a single dielectric material) configured between conductive elements (e.g., a primary conductive element and a secondary conductive element) of an integrated chip, having a large difference in voltage potentials, in a manner which prevents any lateral barrier layers from extending between the conductive elements (i.e., and therefore prevents electrical shorting due to electrical breakdown at the barrier layers). The isolating material effectively forms an isolation trench disposed between the potentials of the two conductive elements, resulting in a high lateral voltage resistance.

It will be appreciated that the examples provided below are not to be read as limiting the application of the inventive concept provided herein. In various embodiments, the method and structure provided herein to form a homogeneous electrically isolating material (e.g., a dielectric material) laterally disposed between conductive elements, may be used to provide isolation between a wide range of conductive elements. For example, in one embodiment, the method and structure may provide electrical isolation between a primary and secondary conductive elements comprising metal wire levels having a large difference in voltage potentials and sharing a common lateral plane. In a more particular embodiment, the method and structure may provide electrical isolation between primary and secondary conductive elements comprising an active circuitry (e.g., at a non-zero voltage potential) and a grounded chip guard ring. In an alternative embodiment, the method and structure may provide electrical isolation between primary and secondary conductive elements comprising metal wiring (e.g., copper wire) respectively connected to two or more high voltage device (e.g., MOSFET devices) having different voltage potentials. In additional embodiments, the method and structure may provide electrical isolation between primary and secondary conductive elements comprising an integrated coupler (e.g., a magnetic coupler, a capacitive coupler), between passive devices, etc.

In one embodiment, an integrated coupler (e.g., a magnetic coupler, a capacitive coupler, etc.) comprises a primary conductive element, having a first voltage potential, and a secondary conductive element, having a second voltage potential. A homogeneous electrically isolating material (e.g., a low-k dielectric material) is configured to form an isolation trench disposed between an electrical network of the primary conductive element (e.g., comprising conductive components coupled to the first voltage potential of the primary conductive element) and an electrical network of the secondary conductive element (e.g., comprising conductive components coupled to the second voltage potential of the secondary conductive element) to provide galvanic isolation between elements of the integrated coupler having different voltage potentials.

The isolating material may extend across a common lateral plane between the electrical network of the primary conductive element and the electrical network of the second conductive element in a manner which prevents any lateral barrier layers from extending between the electrical networks of the first conductive element and the second conductive element. The structure therefore provides a galvanically isolated integrated coupler which avoids electrical shorting between circuits (e.g., at barrier layers), resulting in an improved high voltage resistance coupler.

Figure 2:
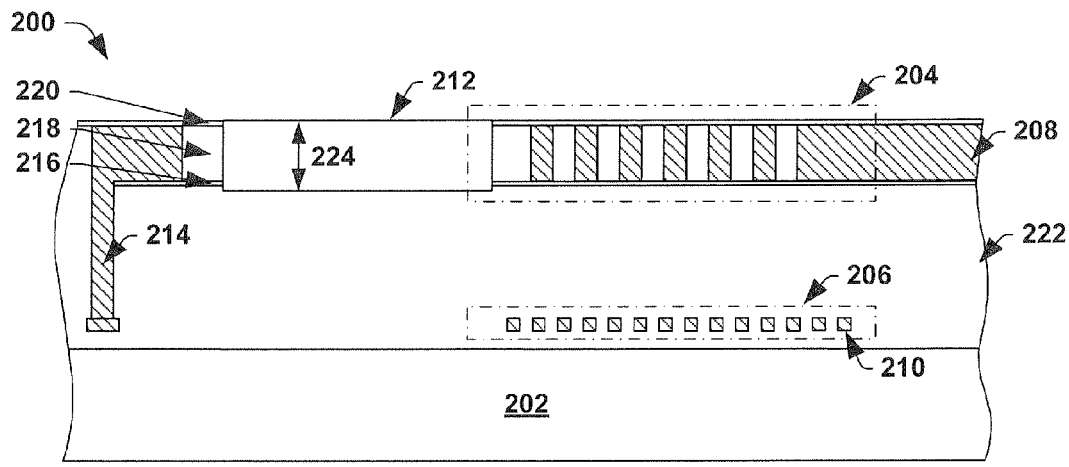
FIG. 2 illustrates a cross sectional view of an integrated chip comprising a magnetic coupler having two isolated circuits separated by an insulating material, as provided herein.

In one embodiment, illustrated in FIG. 2, the primary and secondary conductive elements may comprise MEM based transformers comprising a primary conductive coil 204 and secondary conductive coil 206, respectively formed as part of an integrated chip on a semiconductor body 202. In one specific embodiment, the primary and secondary coils respectively comprise a second metal interconnect level 208 and a first metal interconnect level 210. In such an embodiment, the secondary coil 206 may be connected to a higher metal interconnect level (e.g., second metal interconnect level 208) by via 214. Via 214 therefore provides the first voltage potential (e.g., from a wirebond connection) to the secondary coil 206, resulting in a laterally displacement between the first voltage potential and the second voltage potential of the primary coil 204.

An electrically isolating material 212 is configured to form an isolation trench laterally disposed between the electrical network of the primary coil 204 (e.g., comprising conductive components having the second potential) and the electrical network of the secondary coil (e.g., comprising conductive components, 210 and 214, having the first potential). The isolating material 212 is configured in a manner which prevents any lateral barrier layers (e.g., etch stop layer 216, interlevel dielectric layer 218, etch stop/diffusion barrier layer 220, etc.) from extending between the primary and secondary coils. In one embodiment, the isolating material forms a homogeneous insulating layer comprising a single isolating material 212 that that extends over the vertical height 224 extending from above the second dielectric layer 220 to the underlying dielectric layer 222 (e.g., the isolating material extends to a height that electrically isolates the primary coil 204 from the electrical network of the secondary coil), thereby avoiding electrical shorting between conductive coupler coils (e.g., at barrier layers) and providing a coupler with an improved high voltage resistance between the primary coil 204 and the electrical network of the secondary coil.

The isolating material provided herein may comprise a dielectric material which prevents electrical conduction. In one embodiment, the isolating material has a dielectric constant that is the same or smaller than that of a dielectric layer configured vertically between the primary and the secondary elements. It will be appreciated that isolating materials having lower dielectric constants can allow for improved isolation (e.g., and therefore smaller spaces) between coupler elements depending on the voltages potentials used on an integrated chip. For example, in certain high voltage embodiments, isolating materials having very low dielectric constants may be preferred to avoid dielectric breakdown at high voltages differentials between the electrical networks of the primary and the secondary elements.

In another embodiment, the isolating material 212 may be the same material as that of the dielectric layer 222 configured vertically between the primary and the secondary coils. In additional embodiments, the isolating material may comprise other materials providing electric isolation such as: oxide (e.g., a PSG oxide), low-k dielectric, polyimide, benzocyclobutene (BCB), silicon oxycarbide (SiCo), silicon carbon nitride (SiCN), Silicon Nitride (SiN), etc.

It will also be appreciated that the first and second metal interconnect levels, as referred to herein, may comprise any two metal interconnect levels within a metallization stack having a plurality of metal levels. For example, in one embodiment the first metal interconnect metal may respectively comprise a first thin copper metal level, while the second metal interconnect metal may comprise a last thick copper or aluminum metal level, wherein one or more additional metal levels are comprised between the first and second metal interconnect levels. In another example, the first and second metal interconnect levels may comprise a second to last and a last thick metal level located above one or more thin metal levels.

In an alternative embodiment, respective conductive elements of a coupler may be comprised within the same metal interconnect level. For example, a first metal level may comprise both a primary coil and a secondary coil, wherein the primary coil is laterally separated from the secondary conductive coil. In such an embodiment, the primary and secondary coils may communicate with each other through the production and detection of a magnetic field (e.g., as described in relation to FIG. 3) produced by passing a current through the primary and/or secondary coil.

Figure 3:
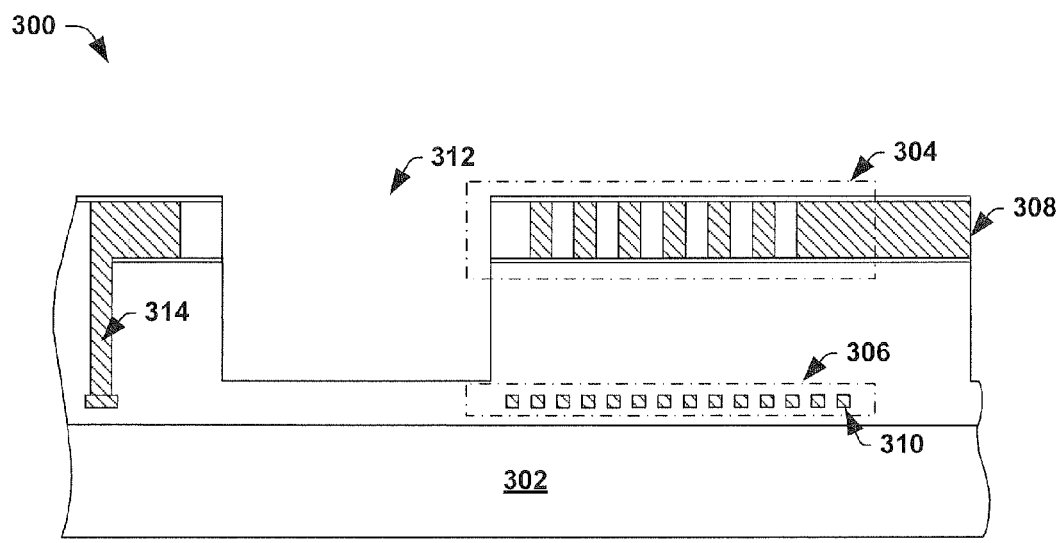
FIG. 3 illustrates a cross sectional view of an alternative embodiment of an isolating circuitry, as provided herein.

In an alternative embodiment, shown in FIG. 3, an isolating trench 312 is configured to extend from above the primary coil 304 to substantially the top of the metal level 310 comprising the secondary coil 306. As shown in FIG. 3, the isolating trench 312 comprises an insulating material comprising air (i.e., having a dielectric constant of 1). The embodiment of FIG. 3 therefore provides a primary coil 304 (e.g., having a first voltage potential) formed on a pedestal that is laterally separated from other voltage potentials (e.g., at via 314) by an air gap, resulting in a low dielectric constant between potentials. In an additional embodiment, the primary coil may comprise an isolated pedestal structure having a pad (e.g., wire-bond pad or a flip chip pad) disposed above metal level 310 of the primary coil 304. The pad allows direct access to the potential of the primary coil by an external electrical connection.

Figure 4:
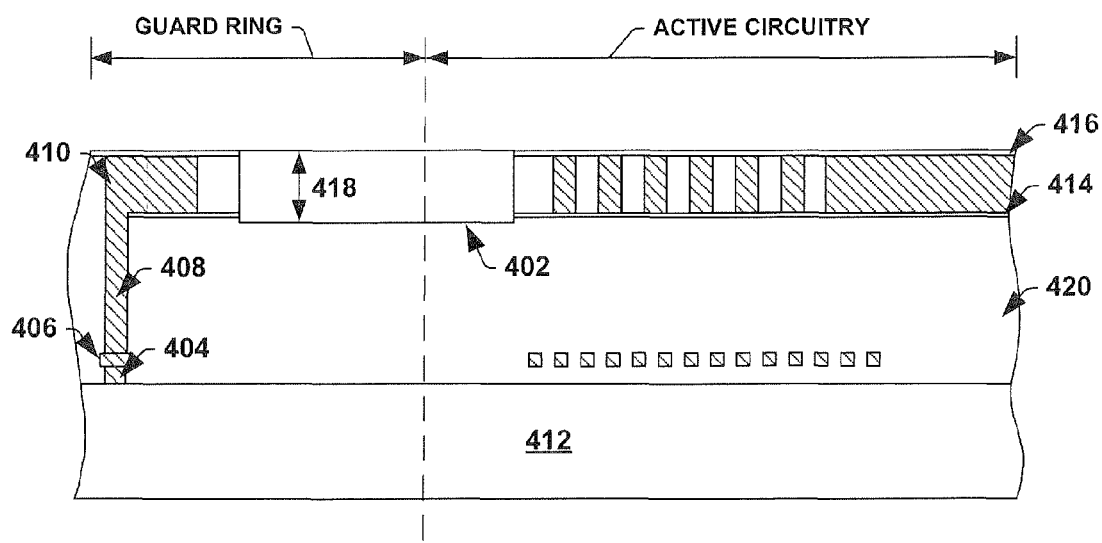
FIG. 4 illustrates a cross sectional view of an integrated chip comprising a guard ring separated by an insulating material from an active circuitry, as provided herein.

In another alternative embodiment, shown in FIG. 4, an isolating material 402 is configured to provide a high lateral voltage resistance between a chip guard ring structure and active circuitry comprised within an integrated chip. A chip guard ring is a protective metal structure that is configured around an integrated chip's active circuitry and which is often held at a grounded potential. The guard ring protects the chip circuitry against physical damage (e.g., moisture or cracks propagating into the chip region) and electrical damage (e.g., ESD).

Physically, the guard ring may comprise a dense configuration of vias (404, 408) and metal levels (406, 410) which are spatially separated from the active circuitry. Electrically, the guard ring is held at a grounded potential due to its connection to grounded semiconductor substrate 412 of the integrated chip by a contact 404. For proper operation the guard ring metal levels are electrically isolated from metal levels within the active area of the chip resulting in a large potential voltage difference between the ground potential of the guard ring and the potential of the active circuitry. To avoid dielectric breakdown between the guard ring and the active circuitry (e.g., at barrier layers), electrically isolating material 402 is configured laterally between the active circuitry and the guard ring. The electrically isolating material prevents any lateral barrier layers (e.g., etch stop layer 414, etch stop/diffusion barrier layer 416, etc.) from extending between active circuitry and the guard ring. In one embodiment, the isolating material 402 forms a homogeneous insulating layer comprising a single isolating material that that extends over the vertical height 418 extending from above etch stop/diffusion barrier layer 416 to the underlying dielectric layer 420, thereby providing a high lateral voltage resistance between the guard ring and the active circuitry.

Figure 5:
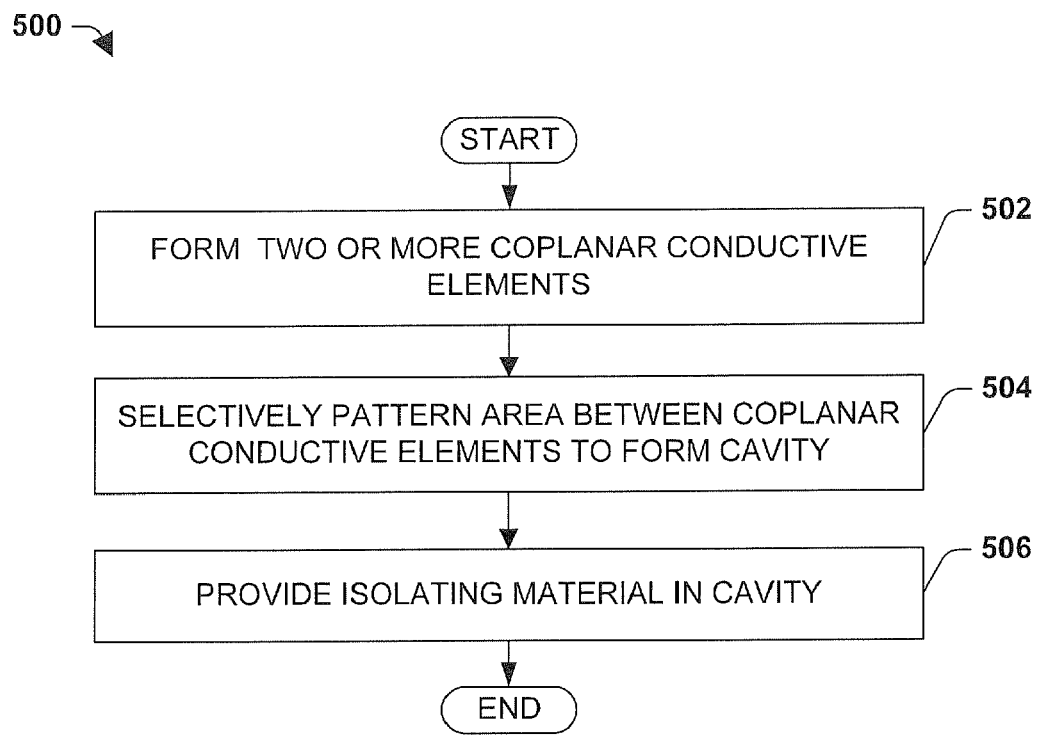
FIG. 5 shows a flow diagram illustrating an exemplary methodology for forming a coupler configured between two isolated circuits.

FIG. 5 illustrates an exemplary method for producing an integrated chip having a high lateral voltage resistance between coplanar conductive elements having a large difference in voltage potentials. The method produces galvanically isolated conductive elements which do not have continuous lateral barrier layers therebetween.

While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, it will be appreciated that the one or more isolation cavities are formed by processing methods which are compatible with presently used technologies, and which result in only minor modifications to the current process sequence.

At 502 two or more coplanar conductive elements are formed in a semiconductor body. In one embodiment, the coplanar conductive elements may comprise coupler elements comprising metal interconnect wires formed using a dual damascene metallization process, as is well known in the art. The metal interconnect wires may comprise copper or aluminum, for example. The conductive coupler elements are formed so that respective coupler elements can communicate (e.g., communicate signals) with other coupler elements (e.g., through transfer of a magnetic field, through transfer of energy by the capacitance between coupler elements, etc.). In one embodiment, the conductive coupler elements are formed within a single metal level of an integrated chip. In an alternative embodiment, conductive coupler elements are formed to comprise different metal interconnect levels of an integrated chip.

An area between the electrical networks of two or more conductive elements is selectively patterned (e.g., by microstructuring methods) to form a cavity at 504. In one embodiment, the surface of a semiconductor body is selectively masked, using a masking agent, to expose an area between conductive coupler elements. In one embodiment, the masking layer may comprise a patterned hardmask, while in an alternative embodiment the masking layer may comprise a photoresist layer. An etchant (e.g., wet etchant, dry etchant) is then used to etch the exposed area and form a cavity. The etchant vertically etches layers comprised between coplanar conductive elements, specifically breaking barrier layers that laterally extend between electrical networks of the conductive elements. In one embodiment, the cavity is etched to a depth that breaks continuous lateral barrier layers between the electrical networks of conductive coupler elements, thereby electrically isolating the electrical networks of respective coupler elements. In an alternative embodiment, the cavity may be etched to a deeper depth.

At 506 an electrically isolating material is provided in the cavity. In one embodiment, the electrically isolating material is formed over the surface of the semiconductor substrate to a depth which fills the cavity. The isolating material therefore is configured laterally between respective conductive elements of the coupler. In one embodiment, the electrically isolating material forms a homogeneous insulating layer that breaks continuous barrier layers between coplanar conductive elements, thereby providing a high lateral voltage resistance between the coplanar conductive elements. In an alternative embodiment, the electrically insulating material comprises air configured to form an isolation trench between coplanar conductive elements.

Figure 6:
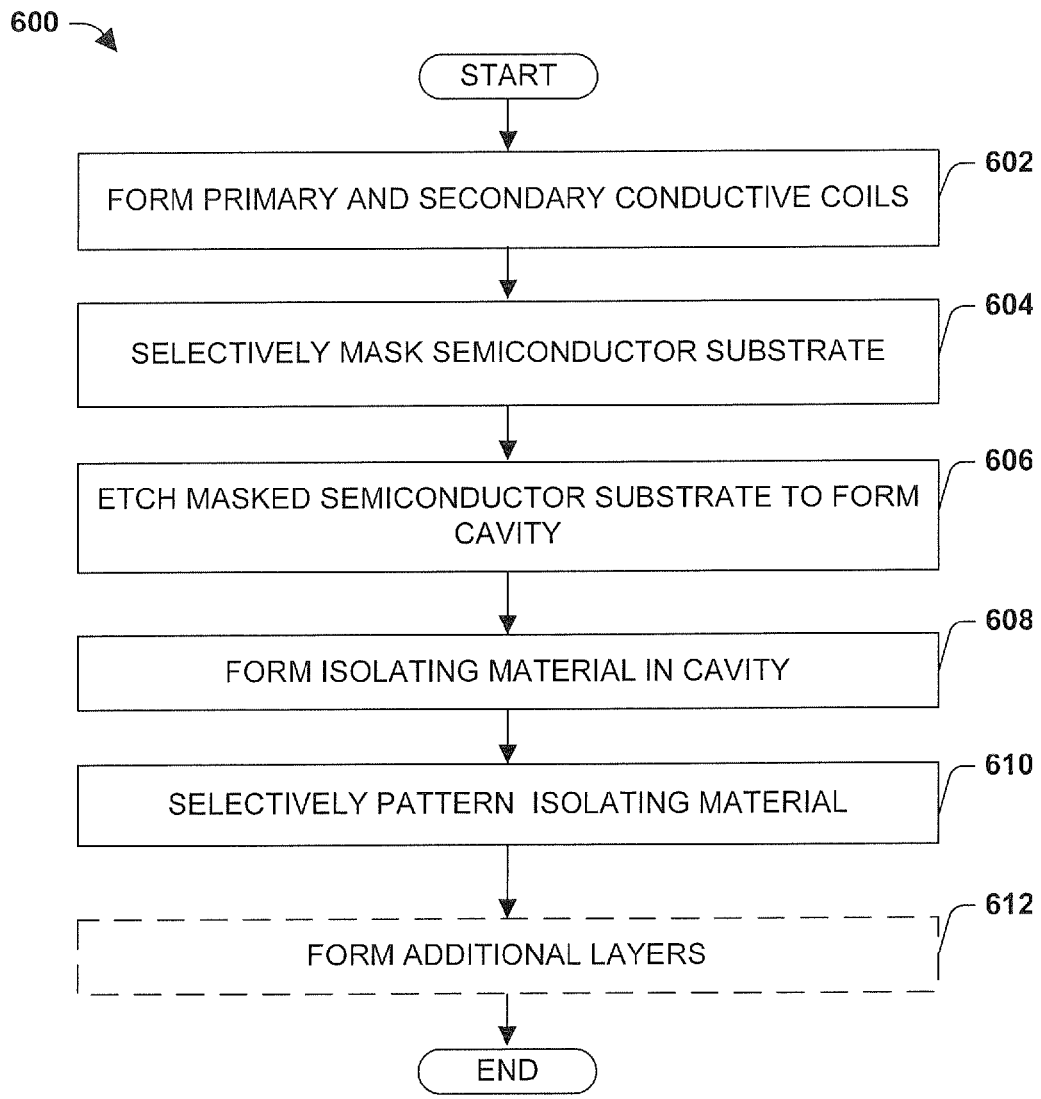
FIG. 6 shows an alternative flow diagram illustrating a detailed methodology for forming a magnetic coupler.

FIG. 6 illustrates a more detailed embodiment of an exemplary method for producing a magnetic coupler having a high lateral voltage resistance between the electrical networks of a primary coil and a secondary coil comprising metal interconnect levels of an integrated chip. The method produces a galvanically isolated magnetic coupler that does not have continuous lateral barrier layers extending between conductive elements having different voltage potentials on a common lateral plane.

At 602 a primary and a secondary coil are formed. The primary and secondary coils may be formed in one or more interlevel dielectric layers formed above a semiconductor substrate. The primary coil may comprise a first voltage potential and the secondary coil may comprise a second voltage potential, wherein the first and second voltage potentials are laterally displaced. The substrate may comprise any type of semiconductor body (e.g., silicon, SiGe, SOD such as a semiconductor wafer or one or more die on a wafer, as well as any other type of semiconductor and/or epitaxial layers formed thereon and/or otherwise associated therewith.

In one embodiment, formation of the primary and secondary coils comprises forming a first interlevel dielectric (ILD) layer above a semiconductor substrate. The first ILD level (e.g., SiCo, oxide) may be selectively patterned to define a first metal level comprising the secondary coil using photolithography and etch techniques well known to one of ordinary skill in the art. A metal is then formed on the patterned ILD layer (e.g., using chemical vapor deposition, electroplating, electroless plating, etc.). In one embodiment, the metal may comprise a copper metal which is sputtered and/or electroplated onto the patterned ILD layer. In an alternative embodiment, the metal may comprise aluminum or some other suitable metal.

An etch stop layer, used to prevent overetching of the second metal level, may be formed above the first ILD layer. In one embodiment, the etch stop layer may comprise a SiN thin film formed using a plasma enhanced chemical vapor deposition (PECVD). A second dielectric layer is formed above the first etch stop layer. In various embodiments, the second dielectric layer may comprise the same material as the underlying dielectric layer or may comprise a dielectric material (e.g., an oxide) offering a greater mechanical support. The second dielectric layer is selectively patterned to define one or more contacts and the metal wires comprising the primary coil.

One or more contacts are then formed in the selectively patterned second dielectric layer through metal deposition (e.g., chemical vapor deposition, electroplating, electroless plating, etc.). The contacts may comprise a copper metal and are configured to electrically couple the first metal level to a second metal level subsequently formed in the selectively patterned second dielectric layer through metal deposition. The contacts connect the first metal level to the second metal level, resulting in the primary coil (comprised on the second metal level) and the electrical network of the secondary coil (electrically connected to the second metal level by the one or more contacts) having electric potentials that are separated at a lateral distance on the same layer (i.e., sharing a lateral plane).

A second etch stop layer, configured to prevent etching of the second metal level from above, may be configured above the second dielectric layer. The combination of the etch stop layers and the dielectric layer, therefore result in a plurality of vertically stacked layers configured between the electrical networks of the primary and the secondary coils. The vertically stacked layers having lateral interfaces connecting the primary and secondary coils result in continuous barrier layers which extend between metal structures comprised within a metal level (e.g., which extend from the primary coil to the secondary coil).

Figure 7:
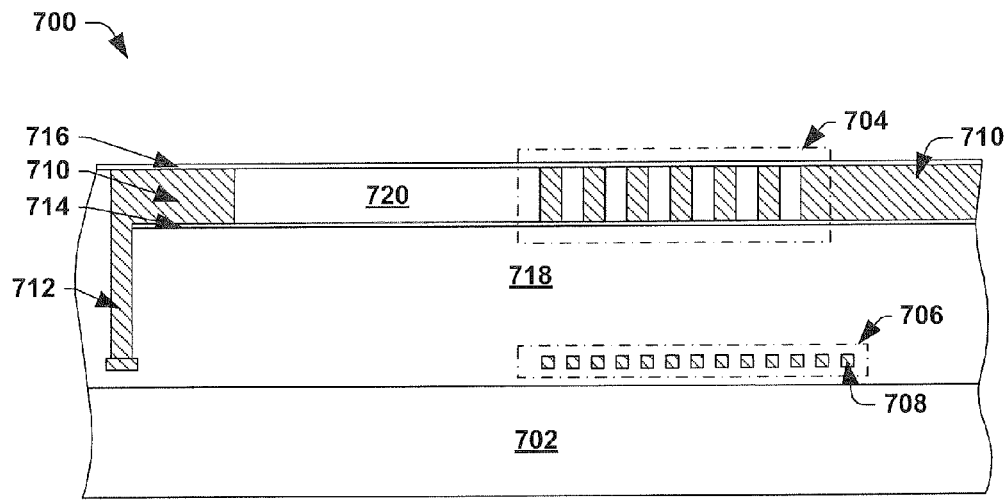
FIGS. 7-13 illustrate cross sectional views of a magnetic coupler formed according to the method of FIG. 6.

FIG. 7 illustrates a magnetic coupler 700, formed according to method 602. The magnetic coupler 700 is formed in a semiconductor body 702 and comprises a primary coil 704 and a secondary coil 706. As illustrated in FIG. 7, the secondary coil 706 is comprised on a first metal level 708, comprised within a first interlevel dielectric layer 718, and the primary coil is comprised on a second metal level 710, comprised within a second interlevel dielectric layer 720. The first metal level 708 is connected to the second metal level 710 by a contact 712 configured above the first metal level 708, thereby resulting in a voltage differential on the second metal level 710 between the voltage potential of the primary coupler's electrical network and the voltage potential of the secondary coupler's electrical network. In other words, the contact 712 couples the potential of the secondary coil 706 to a second metal level 710 that also comprises the primary coil 704, resulting in the voltage potential of the secondary coil and the voltage potential of the primary coil being separated by a lateral distance on the same metal level (i.e., sharing a lateral plane).

Etch stop layers 714 and 716 may be configured above and/or below the second metal level. Etch stop layer 714 is formed during fabrication and extends laterally along the bottom of the second metal level 710, between electrically isolated circuits (i.e., between the primary coil and the electrical network of the secondary coil).

At 604 the semiconductor body is selectively masked. The semiconductor body is selectively masked to provide an unprotected opening in an area between the electrical networks of the primary and the secondary coils. In one embodiment, selectively masking the semiconductor body comprises forming a masking layer on the surface of the semiconductor substrate (e.g., on the second etch stop layer). The masking layer can be selectively patterned to define an area between the primary conductive coil and the electric network of the secondary conductive coil. In one embodiment, the masking layer may comprise a photoresist layer having a thickness of 1-10 um, for example. The photoresist layer may be formed on the substrate by depositing the photoresist onto the substrate and spinning the substrate at a high speed (e.g., 500-3000 RPM) or a sequence of high speeds resulting in an even distribution of photoresist over the surface of the substrate, for example. It will be appreciated that either a positive photoresist, that will be structurally weakened when it is exposed, or a negative photoresist, that will be structurally strengthened when it is exposed, may be used.

In an alternative embodiment, the masking layer may comprise a hard mask. The hard mask can be formed above the semiconductor body and may be, for example, around 50 to 500 nm thick. The hard mask may comprise TiAlN, TiN, Ti, $TiO_2$, Al, AlOx, AlN, TiAl, TiAlOx, Ta, TaOx, TaN, Cr, CrN, CrOx, Zri, ZrOx, ZrN, Hf, HfN, HfOx, silicon-rich nitride (SRN), silicon-rich oxynitride (SRON), silicon oxide, low-k dielectric, high-k dielectric, or any stack or combination thereof.

Figure 8:
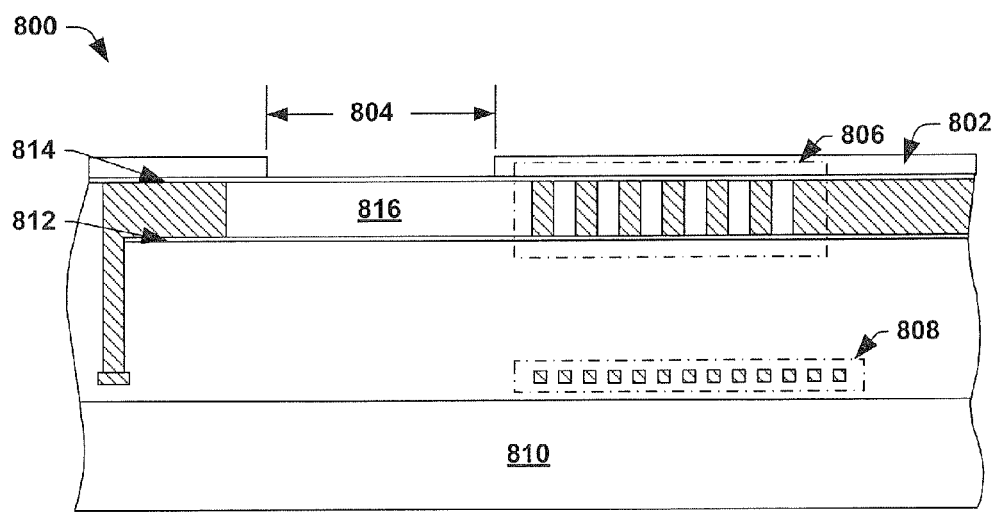

FIG. 8 illustrates a selectively masked semiconductor body. As illustrated in FIG. 8, the masking layer 802 is configured to provide an opening 804 between the electrical networks of the primary coil 806 (e.g., corresponding to primary coil 704) and the secondary coil 808 (e.g., corresponding to secondary coil 706). This opening results in an exposed area that is unprotected by the masking layer.

The masked semiconductor body is etched at 606 to form a cavity. The etching process will apply etchants, at the exposed opening of the semiconductor substrate, that will remove material from the semiconductor substrate and form a cavity between the electrical networks of the primary and secondary coils. In particular, layers forming continuous lateral connections between the primary coil and the electric network of the secondary coil are removed. The masked semiconductor body may be etched using a wet etch chemistry or a dry etch chemistry. In one embodiment, a dry etch may be performed in a low pressure environment using plasma source gases comprising one or more of $SF_6$, $CH_2$, $F_2$ $O_2$, Ar, etc. In alternative embodiments, other source gases may be used. After the etch is completed the masking layer may be removed, for example, by an ashing process.

Figure 9:
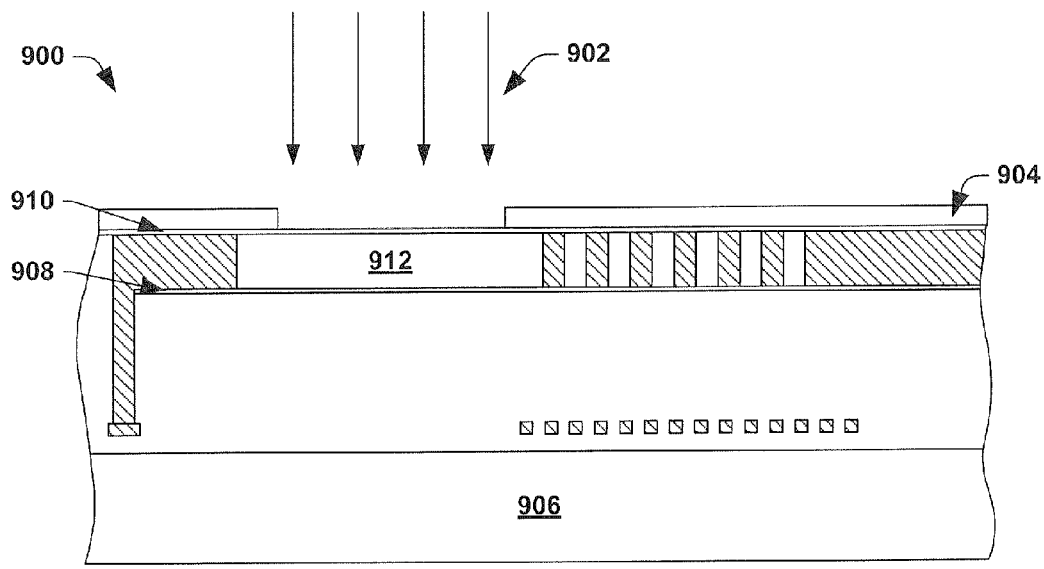
Figure 10:
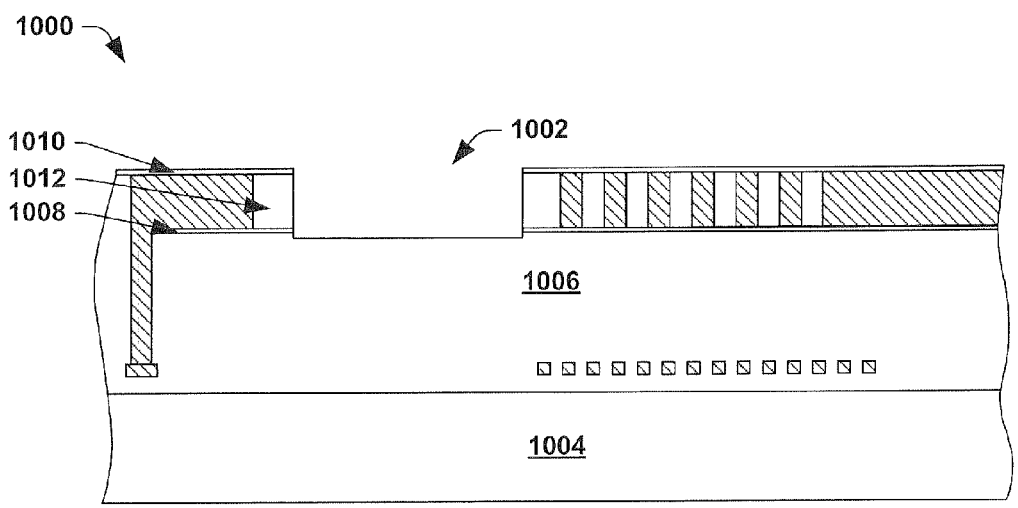

FIGS. 9-10 illustrate a semiconductor substrate undergoing an etch as described in 606. As shown in FIG. 9, an etchant 902 is provided to the opening of the masking layer 904 (e.g., corresponding to masking layer 802). In particular, the etchant will remove the second etch stop layer 910 (e.g., corresponding to element 716), the second dielectric layer 912 (e.g., corresponding to element 720), and the first etch stop layer 908 (e.g., corresponding to element 714) at the exposed opening. The etchant process, therefore breaks the barrier layers in the lateral direction in order to avoid continuous lateral barrier layers between conductive elements on a metal level having different potentials.

FIG. 10 illustrates the semiconductor substrate after the etching is completed. As shown in FIG. 10, a cavity 1002 has been formed between the primary coil and the electrical network of the secondary coil. The cavity 1002 severs the barrier layers comprising the second etch stop layer 1010, the second dielectric layer 1012, and the first etch stop layer 1008. Therefore, after etching is completed, continuous barrier layers do not extend between the electrical network of the secondary coil and the electrical network of the primary coil.

At 608 an electrically isolating material is formed in the cavity. The isolating material is configured laterally between the first conductive coil and the second conductive coil. In one embodiment, the isolating material comprises a homogenous insulating layer (i.e., a single insulating material) that extends over the vertical height of the first conductive coil to provide a high lateral voltage resistance between the first and the second conductive coil.

Figure 11:
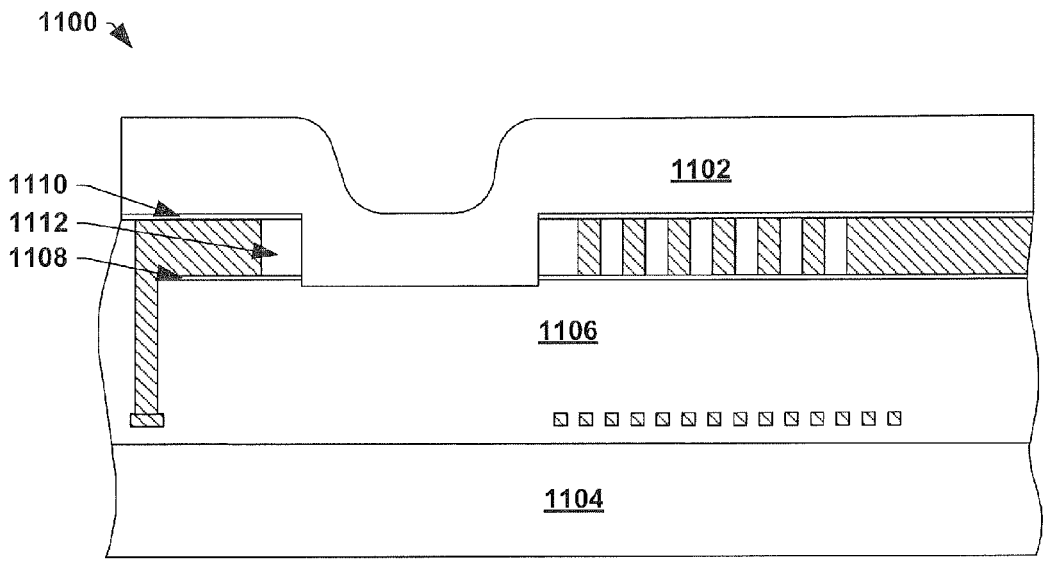

In one embodiment, shown in FIG. 11, the isolating material may comprise an oxide layer 1102 (e.g., a PSG oxide layer) formed above the second etch stop layer. In such an embodiment, the oxide layer may be deposited using a plasma enhanced process (e.g., a low temperature plasma enhanced process) to fill the cavity (e.g., corresponding to cavity 1002). The oxide layer 1102 may also extend along the surface of the second etch stop layer to provide an insulating layer that is used for further processing. As illustrated in FIG. 11, the vertical height of the isolating layer extends from above the second dielectric layer 1112 to the underlying dielectric layer 1106 (e.g., therefore breaking the continuity of etch stop layers 1108 and 1110).

Figure 12:
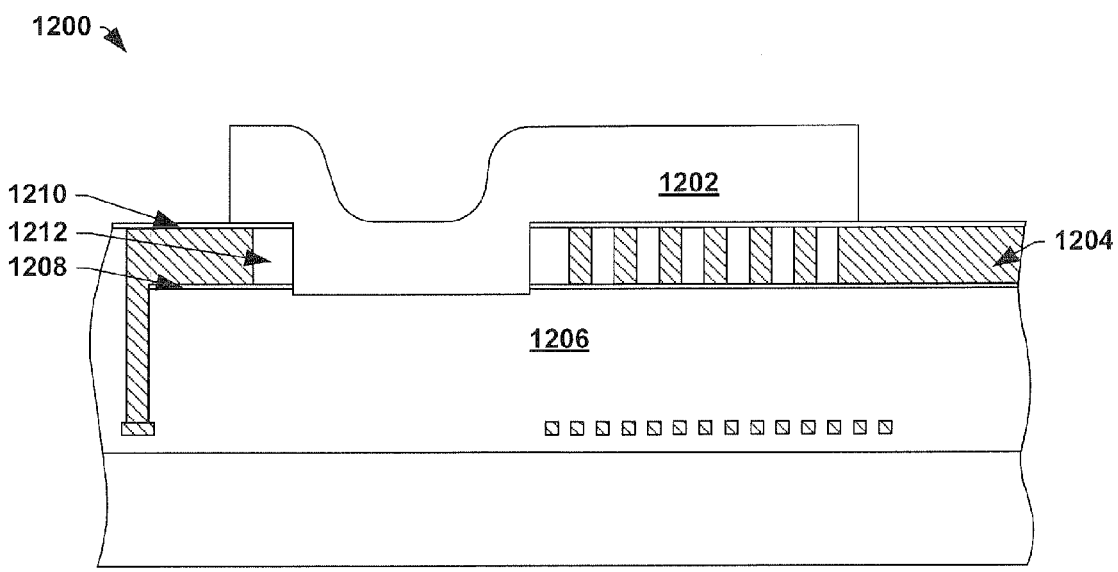

The isolating material may be selectively patterned at 608. Selectively patterning the isolating material allows for additional electrical contacts to be formed on the second metal level. In one embodiment, wherein the second metal level comprises the last thick metal interconnect level, a pad structure may be formed above the second metal level. The pad may comprise a wire-bond pad or a flip chip (i.e., C4) pad. As shown in FIG. 12 the electrically isolating oxide layer 1202 is removed from above the second metal level 1204, thereby exposing the second metal level (it will be appreciated that the second etch stop/diffusion layer 1210 may remain above the second metal level 1204 to provide a barrier layer between the second metal level 1204 and subsequent layers).

At 612 additional layers may be formed onto the semiconductor body. In one embodiment, the additional layers comprise pad layers formed on the second metal level. For example, a nickel phosphorus layer (NiP) may be formed by electroplating or electroless plating above the second metal level. The NiP layer provides structural support to a contact pad. A gold layer may be formed above the NiP layer to aid in conduction. Alternatively, the additional layers may comprise metal interconnect levels configured above the primary coil in the stack or protective materials formed on the substrate.

Figure 13:
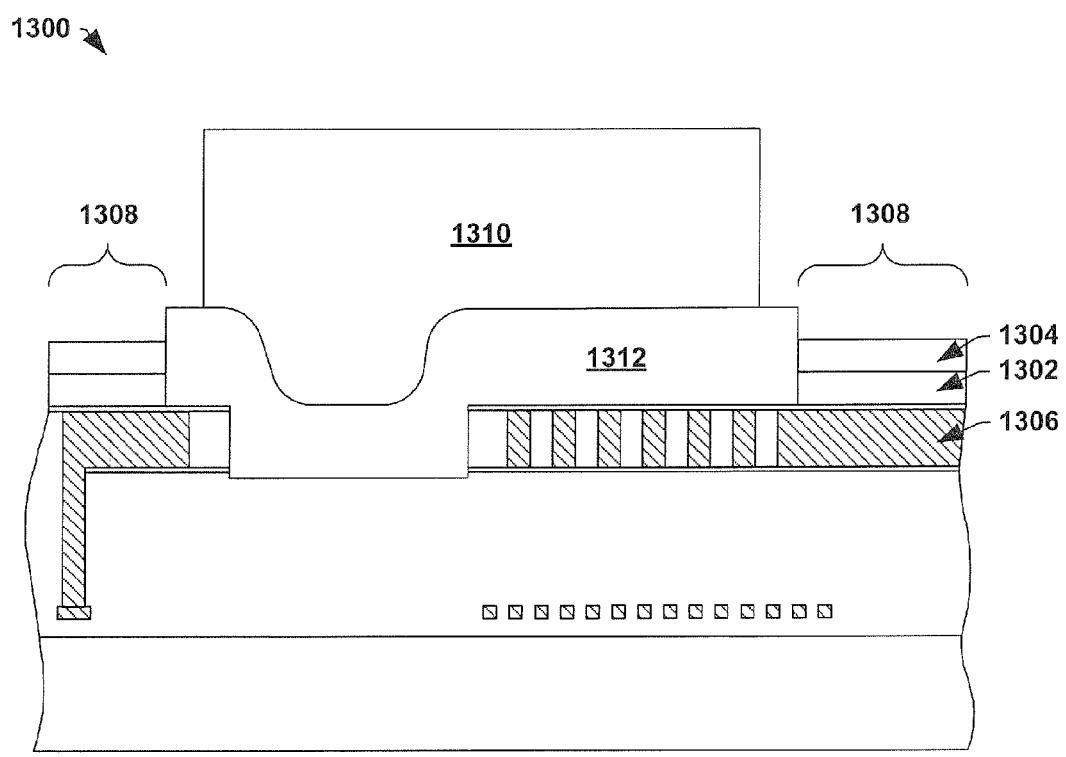

A polyimide layer may also be selectively formed above the insulating layer. The polyimide layer forms a protective layer that encapsulates the integrated chip. FIG. 13 illustrates one embodiment, wherein a cross sectional view of a coupler structure wherein a NiP layer 1302 and a conductive pad layer 1304 (e.g., gold layer) are formed above the second metal level. The NiP layer 1302 and the conductive pad layer 1304 collectively comprise a pad structure 1308 which may be used for external connections to the integrated chip. A polyimide protective layer 1310 is also formed on the semiconductor substrate above the oxide layer 1312 (e.g., corresponding to oxide layer 1202).

Figure 14:
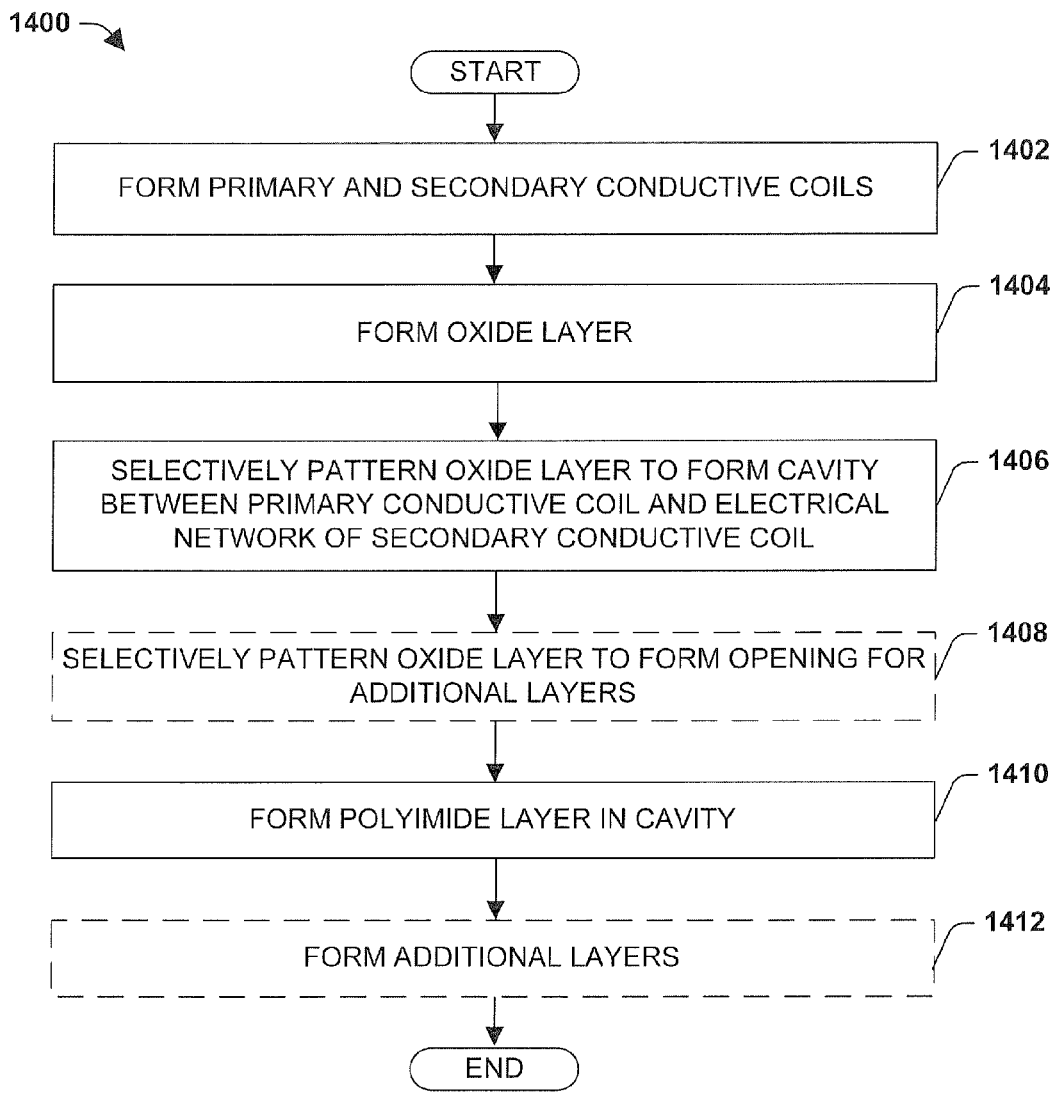
FIG. 14 shows an alternative flow diagram illustrating another detailed methodology for forming a magnetic coupler.

In an alternative embodiment, shown in FIG. 14, a method for producing a magnetic coupler having a high lateral voltage resistance between the electrical networks of a primary coil and a secondary coil comprising metal interconnect levels of an integrated chip is disclosed. In such an embodiment, the primary and secondary coils are formed at 1402. The primary and secondary coils may be formed using a method as described at 602. An oxide layer is formed above the second etch stop layer. The oxide may be formed as described above in element 608.

At 1406 the oxide layer is selectively patterned to form a cavity between the primary conductive coil and the electrical network of the secondary conductive coil. In one embodiment, patterning the oxide layer comprises selectively masking the oxide layer using a first masking layer. The first masking layer may comprise a hard mask or a photoresist and is configured to provide an opening between the electrical networks of the primary coil and the secondary coil (e.g., as shown in FIG. 8). This opening results in an exposed area that is unprotected by the first masking layer. The masked oxide layer is selectively etched to form a cavity. The selective etching forms a cavity at the opening in the first masking layer and may be performed using photolithography and etch techniques as described above in elements 604-606. The selective etching breaks through lateral barrier layers (e.g., etch stop layers and second dielectric layer) forming a lateral connection between the electrical networks of the primary and the secondary coils.

At 1408 the oxide layer is optionally selectively patterned a second time to form an opening for additional layers (e.g., pad layers) to be formed. The second selective patterning may comprise forming a second masking layer on the oxide layer. The second masking layer may comprise a hard mask or a photoresist and is configured to provide an opening at a location that allows for additional electrical contacts to be formed on the second metal level. In one embodiment, wherein the second metal level comprises the last thick metal interconnect level, the opening is formed above the second metal level to allow a pad structure (e.g., a wire-bond pad or a flip chip pad) to be formed above the second metal level.

At 1410 a polyimide layer is selectively formed above the oxide layer and is configured to fill the cavity. Formation of the polyimide layer as provided herein results in a polyimide layer laterally configured between the primary and secondary coils.

At 1412 additional layers are optionally formed on the semiconductor substrate. In one embodiment, the additional layers comprise pad layers formed on the second metal level exposed at the opening in the oxide layer. For example, a nickel phosphorus layer (NiP) may be formed by electroplating or electroless plating above the second metal level.

Figure 15:
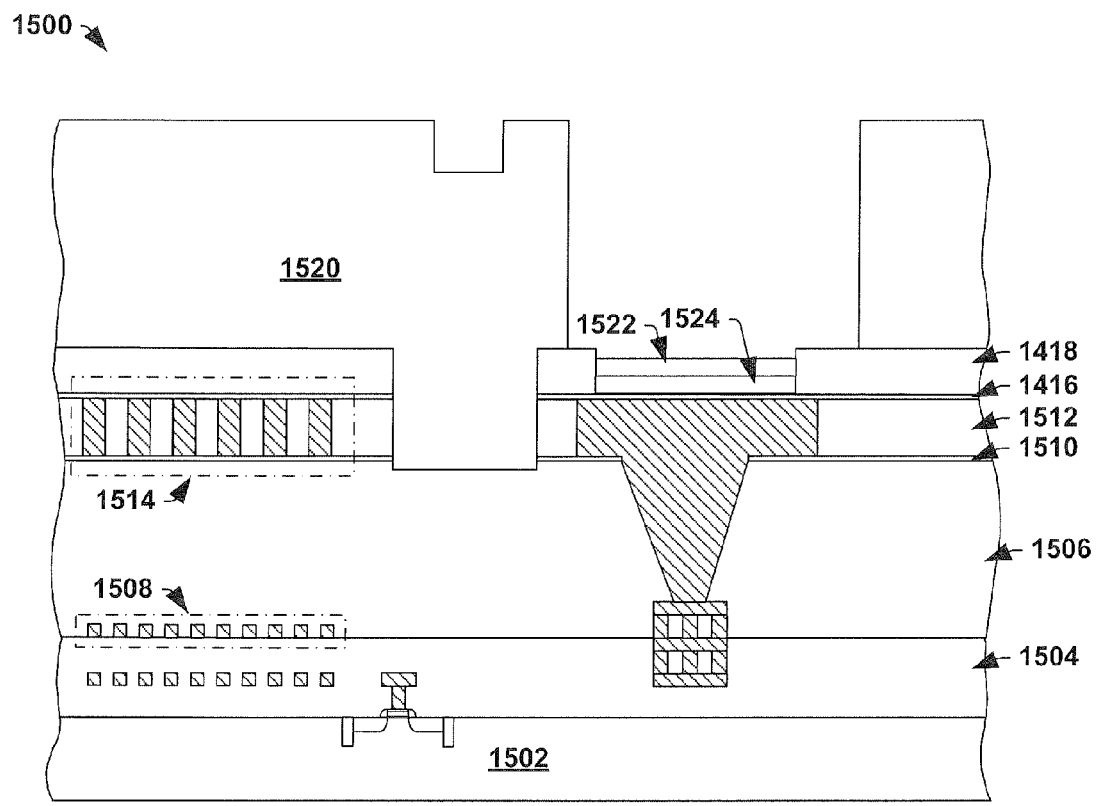
FIG. 15 illustrates a cross sectional view of a magnetic coupler formed according to the method of FIG. 14.

FIG. 15 illustrates an embodiment of a magnetic coupler formed according to the method of FIG. 14. As illustrated in FIG. 15, a polyimide layer 1520 is configured to fill cavity configured between the primary conductive coil 1514 and an electrical network of secondary conductive coil 1508. The polyimide layer vertically traverses a first etch stop layer 1510, a dielectric layer 1512, a second etch stop layer 1516, and an oxide layer 1518 (e.g., correlating to oxide layer 1202 of FIG. 12). A NiP layer 1522 and a conductive pad layer 1524 collectively comprise a pad structure which may be used for external connections to the integrated chip.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An electrically isolating circuit, comprising:
a primary conductive element comprised within an integrated chip, the primary conductive element comprised within a first electrical network having a first voltage potential;
a secondary conductive element comprised within the integrated chip, the secondary conductive element comprised within a second electrical network located lateral to the primary conductive element and having a second voltage potential; and
an electrically isolating material configured to form an isolation trench disposed laterally disposed between the electrical networks of the primary conductive element and the secondary conductive element, the electrically isolating material forming a homogeneous electrically insulating layer that prevents continuous barrier layers from extending between the electrical networks of the primary conductive element and the secondary conductive element, thereby providing a high lateral voltage resistance between the electrical networks of the primary conductive element and the second electrical network of the secondary conductive element.

2. The electrically isolating circuit of claim 1, wherein
the primary conductive element comprises a primary conductive coil configured to produce a magnetic field; and
the secondary conductive element comprises a secondary conductive coil configured to sense the magnetic field produced by the primary conductive coil.

3. The electrically isolating circuit of claim 2,
wherein the isolation trench vertically extends from above the primary conductive coil to substantially the top of the secondary conductive element, and
wherein the electrically isolating material comprises air having a dielectric constant substantially equal to 1.

4. The electrically isolating circuit of claim 2, wherein the primary conductive coil comprises a second metal interconnect level and wherein the secondary conductive coil comprises a first metal interconnect level.

5. The electrically isolating circuit of claim 2, wherein the continuous barrier layers comprise an etch stop layer or a diffusion barrier layer.

6. The electrically isolating circuit of claim 1, wherein the electrically isolating material comprises an oxide.

7. The electrically isolating circuit of claim 1, wherein the electrically isolating material comprises a polyimide.

8. The electrically isolating circuit of claim 1, wherein
the primary conductive element comprises an active circuitry of the integrated chip; and
the secondary conductive element comprises a guard ring of the integrated chip.

* * * * *